(12) United States Patent
Nozawa et al.

(10) Patent No.: US 7,874,781 B2
(45) Date of Patent: Jan. 25, 2011

(54) SUBSTRATE PROCESSING APPARATUS (75) Inventors: Toshihisa Nozawa, Amagasaki (JP); Takaaki Matsuoka, Minato-Ku (JP)

(73) Assignee: Tokyo Electron Limited, Tokyo (JP)

( * ) Notice: Subject to any disclaimer, the term of this patent is extended or adjusted under 35 U.S.C. 154(b) by 1182 days.

(21) Appl. No.: 10/569,378

(22) PCT Filed: Aug. 26, 2004

(86) PCT No.: PCT/JP2004/012276
§ 371 (c)(1),
(2), (4) Date: Feb. 24, 2006

(87) PCT Pub. No.: WO2005/022627
PCT Pub. Date: Mar. 10, 2005

(65) Prior Publication Data
US 2007/0000612 A1    Jan. 4, 2007

(30) Foreign Application Priority Data
Sep. 1, 2003    (JP) .............................. 2003-309367

(51) Int. Cl.
*H01L 21/677* (2006.01)
(52) U.S. Cl. .................. 414/217; 414/222.12; 414/939
(58) Field of Classification Search ................. 414/217, 414/222.12, 744.4, 744.5, 939
See application file for complete search history.

(56) References Cited

U.S. PATENT DOCUMENTS

| | | | | |
|---|---|---|---|---|
| 4,976,610 A * | 12/1990 | Yates | ........................... | 432/11 |
| 5,571,330 A * | 11/1996 | Kyogoku | ..................... | 118/719 |
| 6,427,096 B1 * | 7/2002 | Lewis et al. | .................. | 700/228 |
| 6,709,521 B1 * | 3/2004 | Hiroki | ......................... | 118/719 |
| 6,749,390 B2 * | 6/2004 | Woodruff et al. | ......... | 414/744.5 |
| 7,575,406 B2 * | 8/2009 | Hofmeister et al. | .......... | 414/217 |
| 2005/0238464 A1 * | 10/2005 | Matsuoka et al. | ............ | 414/217 |

FOREIGN PATENT DOCUMENTS

| | | |
|---|---|---|
| JP | 03-184331 A | 8/1991 |
| JP | 06-097258 A | 4/1994 |
| JP | 07-231028 A | 8/1995 |
| JP | 09-162263 A | 6/1997 |
| JP | 10-056051 A | 2/1998 |
| JP | 11-284048 A | 10/1999 |
| JP | 11-345859 A | 12/1999 |

OTHER PUBLICATIONS

International Search Report (Nine (9) pages) dated Nov. 30, 2004 including English Translation.

* cited by examiner

*Primary Examiner*—Michael S Lowe
(74) *Attorney, Agent, or Firm*—Crowell & Moring LLP (57) ABSTRACT

A substrate processing apparatus includes a plurality of process chambers (20) for applying a process to substrate accommodated therein and a conveyance case (24) that conveys the accommodated substrates to the process chambers (20) and a transfer mechanism that moves the conveyance case (24) along a moving path. The conveyance case accommodates the substrates in an isolated state from an external atmosphere. The plurality of process chambers (20) are arranged in an aligned state on both sides of a moving path of the conveyance case (24). The conveyance case (24) has two conveyance ports (24a) in response to conveyance ports (20a) of the process chambers (20) arranged in alignment in two rows.

15 Claims, 9 Drawing Sheets

SUBSTRATE PROCESSING APPARATUS

TECHNICAL FIELD

The present invention relates to substrate processing apparatuses and, more particularly, to a substrate processing apparatus having a moving mechanism that conveys a substrate such as a semiconductor wafer or the like to a process chamber that processes the wafer under a predetermined environment.

BACKGROUND ART

In processing a substrate such as a semiconductor wafer or the like, many processes to supply a process gas under a predetermined reduced pressure atmosphere are used. In many cases, such a process is performed while placing a substrate in a process chamber which can maintain a reduced pressure atmosphere. Processing a substrate generally includes a plurality of processes, and a plurality of process chambers for performing those processes are connected to a substrate conveyance chamber and the substrate is carried into a process chamber and carried out of the process chamber by a conveyance mechanism such as a robot so as to be conveyed to another process chamber.

In such a substrate processing apparatus, it is general that a plurality of process chambers and a load-lock chamber are arranged around a conveyance chamber, and a robot in the conveyance chamber conveys a substrate via an arm. The load-lock chamber is a pressure adjusting chamber provided for carrying a substrate in the conveyance chamber or carrying a substrate out of the conveyance chamber. That is, since the conveyance chamber is connected to the process chambers, inside the conveyance chamber must be maintained under a reduced pressure atmosphere close to an environment inside the process chambers. Thus, it is so constructed to isolate a space inside the conveyance chamber by providing the load-lock chamber.

Although various processes are applied to a substrate, there may be a case in which a process time in each process differs greatly. In order to raise a throughput of substrate processing, it is preferable that the process time required for each process is almost equal. Therefore, in order to process substrates of the same number of sheets for the same process time, it is general to provide a plurality of process chambers to perform concurrently for a process taking a long process time. That is, it is preferable to adjust a number of substrates being processed per unit time is the same for each process.

Figure 1:
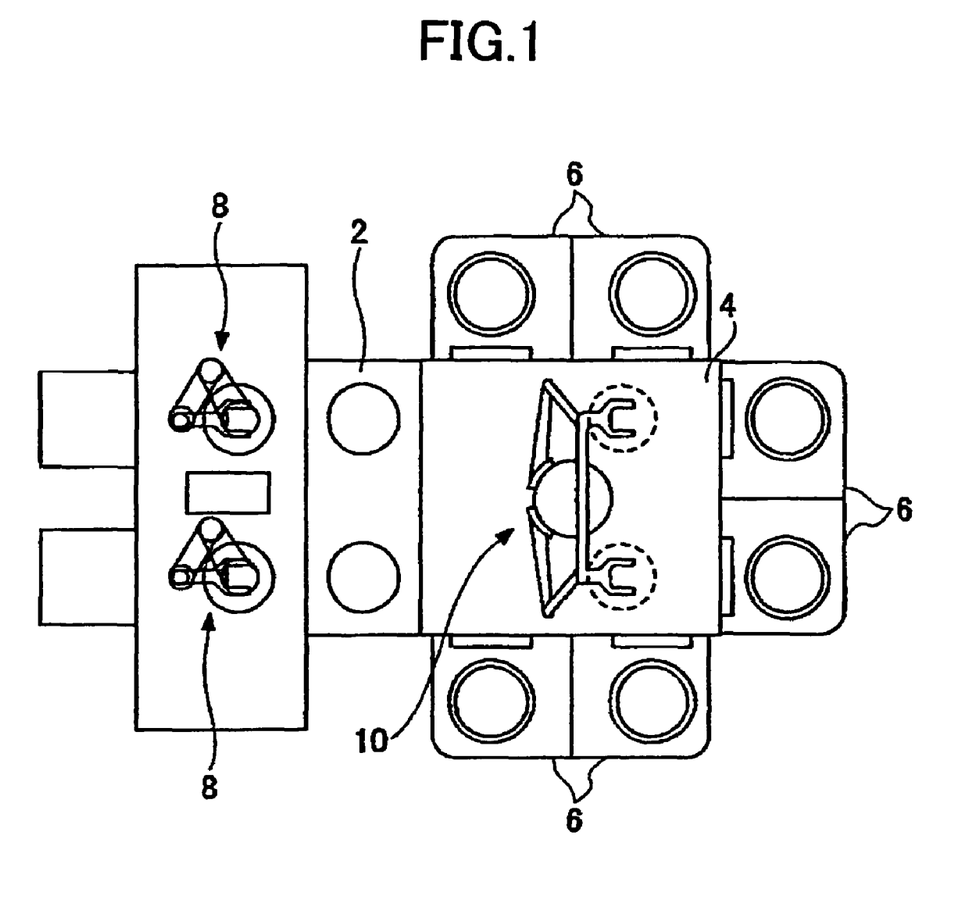
FIG. 1 is an outline plan view showing an entire structure of a conventional substrate processing apparatus.

FIG. 1 is a plan view showing an example of a conventional substrate processing apparatus provided with a plurality of process chambers for performing the same process. The substrate processing apparatus shown in FIG. 1 comprises a load-lock chamber 2, a conveyance chamber 4 connected to one side of the load-lock chamber 2 and six process chambers 6 connected to remaining three sides of the load-lock chamber 2.

The load-lock chamber 2 is capable of accommodating two sheets of substrate at the same time. Two transfer robots 8 for carrying the substrates into the load-lock chamber 2 or carrying the substrates out of the load-lock chamber 2 are installed in the vicinity of the load-lock chamber 2.

The interior of the conveyance chamber 4 connected to the load-lock chamber 2 is capable of being maintained at a reduced pressure environment, and when the load-lock chamber 2 is set to the predetermined reduced pressure environment (degree of vacuum), the rotating-type transfer robot 10 in the conveyance chamber 4 picks up and holds substrates in the load-lock chamber 2, and conveys the substrates to the process chamber 6.

The transfer robot 10 has two arms and is capable of transferring two substrates simultaneously. Therefore, two sets of process chamber 6 are connected to the conveyance chamber 4 in a state where the two sets are arranged side by side so that two sheets of substrate held by the two arms are carried into the two process chambers, respectively, at the same time.

A total of six sets of process chamber 6 of which two each are connected to the three sides of the conveyance chamber 4 other than the side to which the load-lock chamber 2 is connected, respectively, so as to reduce a process time per one sheet of substrate in the process step by performing the process by the six sets of process chamber 6.

It is also suggested to provide a transfer mechanism having arms to hold substrates and capable of linearly moving within the conveyance chamber 4 instead of the above-mentioned rotating type transfer robot.

Moreover, there is also suggested a method of conveying substrates from a load-lock chamber to a process chamber by a conveyance case having a transfer mechanism (for example, refer to Patent Documents 1 and 2). In this method, there is no need to arrange a transfer robot in a conveyance chamber, and a number of process chambers is not limited by the transfer robot and the configuration of the conveyance chamber, thereby enabling a reduction in an installation area of an entire substrate processing apparatus.

The following patent documents disclose techniques relating to prior art of the present invention.

(Patent Document 1) Japanese Laid-Open Patent Application No. 3-184331

(Patent Document 2) Japanese Laid-Open Patent Application No. 6-97258

In the above-mentioned substrate processing apparatus shown in FIG. 1, since it is necessary to arrange the process chambers and the load-lock chamber to surround the conveyance chamber, there is a limit in the number of process chambers that can be arranged. In the example shown in FIG. 1, the number of process chambers connectable to the conveyance chamber 4 is six at the maximum.

Although the number of sides to which the process chambers are connectable is increased by making the configuration of the conveyance chamber to be a polygonal shape of more than hexagon, one side may be smaller than a size of the process chamber, and, as a result, the process chamber cannot be connected.

Thus, there is a limit in the number of process chambers that can be provided to the conventional substrate processing apparatus, and there is a problem in that it cannot deal with a process to continuously performing many steps or a process to concurrently perform a large amount of processes each having one or plurality of steps.

When a transfer mechanism of a movable type such as a linear-type conveyance mechanism instead of the rotating-type transfer robot, the restriction in the number of process chambers due to the configuration of the conveyance chamber is eliminated. However, since the transfer mechanism moves in the conveyance chamber which is to be maintained at a vacuum and clean atmosphere, the transfer mechanism may be a generation source of particles. Especially, there is a problem in that particles may be generated by a cable for supplying electric power to the transfer mechanism being drawn, which is a cause of pollution of substrates.

Moreover, if the number of process chambers is increased, a space of the conveyance chamber is also increased, and there is a problem in that a pump having a large exhaust capacity is needed to maintain such as large space under a reduced pressure environment, which increases a cost. Further, there also is a problem in the entire apparatus is enlarged by enlargement of the conveyance chamber, which results in an increase in an area occupied by the apparatus.

The present invention was made in view of the above-mentioned problems, and an object of the present invention is to provide a substrate processing apparatus which can convey substrates to a plurality of process chambers while maintaining an atmosphere of substrates to be processes at a predetermined environment and reduce an installation area of the entire apparatus.

MEANS TO SOLVE THE PROBLEMS

In order to solve the above-mentioned problems, there is provided according to the present invention a substrate processing apparatus comprising: a plurality of process chambers for applying a process to substrate accommodated therein; a conveyance case that accommodates the substrates in an isolated state from an external atmosphere and conveys the accommodated substrates to the process chambers; and a moving mechanism that moves the conveyance case along a moving path, wherein said plurality of process chambers are arranged in an aligned state on both sides of the moving path of said conveyance case, and said conveyance case has two substrate carry-in and carry-out ports in response to substrate carry-in and carry-out ports of said process chambers arranged and aligned in two rows.

In the above-mentioned substrate processing apparatus, it is preferable that said conveyance case includes a substrate transfer mechanism having first and second arms so that the first arm performs carry-in and carry-out of the substrates with respect to the process chambers in the row on one side and the second arm performs carry-in and carry-out of the substrates with respect to the process chambers in the row on opposite side. Additionally, it is preferable that said substrate transfer mechanism includes a single electric motor and a power transfer mechanism that transfer power of the electric motor to said first and second arms, and said first and second arms are configured and arranged to move symmetrically in directions opposite to each other by the power of the single electric motor.

Additionally, in the substrate processing apparatus according to the present invention, the process chambers may be configured and arranged to process the substrates under a reduced pressure, and said conveyance case may be configured and arranged to be air-tight so that an interior thereof is maintained at a reduced pressure environment. Further, said conveyance case is preferably configured and arranged to be connectable to a vacuum exhaust mechanism at a position where the substrates are carried-in from outside. Additionally, a load-lock chamber may be arranged at a position along said moving path, the load-lock chamber so as to maintain an atmosphere of the substrates being conveyed by said conveyance case at a reduced pressure environment beforehand, and said conveyance case may be configured and arranged to convey the substrates between said load-lock chamber and said process chambers while maintaining the interior at the reduced pressure environment.

Further, said conveyance case and said moving mechanism may be located in a conveyance chamber configured and arranged to be air-tight so as to maintain an interior thereof at a reduced pressure environment, or said conveyance case and said moving mechanism may be located in a conveyance chamber in which an inert gas is filled. Additionally, it is preferable that said conveyance case and said moving mechanism are located in a conveyance chamber which has an interior being maintained at an atmospheric pressure or in which an inert gas is filled, and a vacuum exhaust port is provided to substrate carry-in and carry-out ports of said conveyance case so as to form a vacuum in a space formed between the substrate carry-in and carry-out ports of said conveyance case and substrate carry-in and carry-out ports of said process chambers in a state where the substrate carry-in and carry-out ports of said conveyance case are connected to the substrate carry-in and carry-out ports of said process chambers.

Additionally, there is provided according to the present invention a conveyance case that conveys substrates to a plurality of process chambers arranged in alignment on both sides in a longitudinal direction of a conveyance chamber, the conveyance case accommodating the substrates in an isolated state from an external atmosphere and having two substrate carry-in and carry out ports in response to substrate carry-in and carry-out ports of said process chambers arranged in alignment in two rows.

It is preferable that the two substrate carry-in and carry-out ports of said conveyance case are connected at the same time to the substrate carry-in and carry-out ports of the two process chambers of the process chambers aligned in two rows, and a substrate transfer mechanism is provided to carry-in and carry-out the substrates at the same time to the two process chambers on both sides.

Additionally, it is preferable that the conveyance case according to the present invention comprises a substrate transfer mechanism having first and second arms so that the first arm performs carry-in and carry-out of the substrates with respect to the process chambers in the row on one side and the second arm performs carry-in and carry-out of the substrates with respect to the process chambers in the row on opposite side. It is preferable that said substrate transfer mechanism includes a single electric motor and a power transfer mechanism that transfers power of the electric motor to said first and second arms, and said first and second arms are configured and arranged to move symmetrically in directions opposite to each other by the power of the single electric motor.

EFFECT OF THE INVENTION

As mentioned above, according to the present invention, the substrates can be carried to the plurality of process chambers while maintaining an atmosphere of the substrates to be processed at a predetermined environment, and an installation area of the entire apparatus can be reduced. Additionally, there is no restriction in the number of process chambers to connect due to a configuration of the conveyance chamber, and an arbitrary number of process chambers and different processing apparatuses may be arranged along a conveyance path.

EXPLANATION OF REFERENCE NUMERALS 20 process chamber
20a conveyance port
22 conveyance chamber
23 sidewall
24 conveyance case
24a conveyance port
26 load-lock chamber
28 transfer robot
30 linear guide
32 lead screw
34 frame
36, 38 gate valve
40 connection plate
42 bellows
44 O-ring
46 air cylinder
48 linear guide
50 vacuum exhaust port
52 purge port
54 vacuum sensor
60 electric motor
60b, 62a, 62b, 64a, 66a synchronous pulley
62 common arm
60a rotational shaft
64 first arm
66 second arm
68 end-effector
70, 72, 74 timing belt
80 processing apparatus
90 cassette placement stage

BEST MODE FOR CARRYING OUT THE INVENTION

Figure 2:
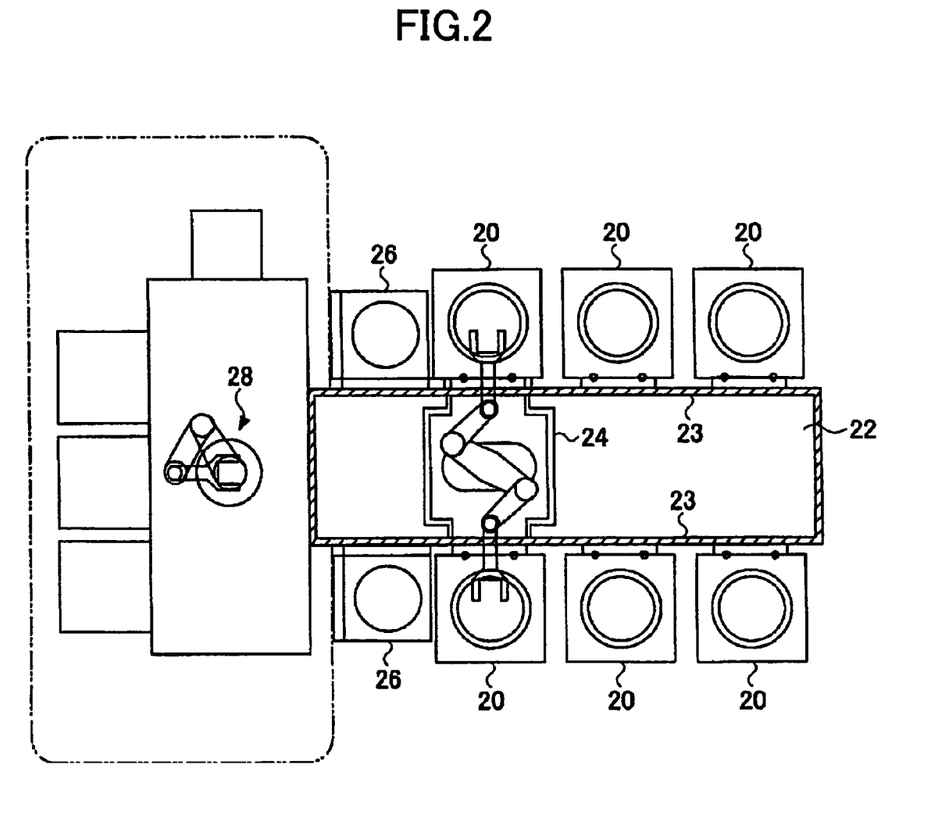
FIG. 2 is an outline plan view showing an entire structure of a substrate processing apparatus according to a first embodiment of the present invention.

Next, a description will be given, with reference to FIG. 2, of a substrate processing apparatus according to a first embodiment of the present invention. FIG. 2 is a plan view of the substrate processing apparatus according to the first embodiment of the present invention.

The substrate processing apparatus shown in FIG. 2 is an apparatus for applying a process to substrates such as semiconductor wafers or the like under a reduced pressure in a plurality of process chambers 20. The plurality of process chambers 20 (six sets in FIG. 2) are connected to sidewalls constituting a conveyance chamber 22. The conveyance chamber 22 is constituted to be air-tight, and a conveyance case 24 and a moving mechanism, which moves the conveyance case 24, are provided inside the conveyance chamber 22. Accordingly, a moving path along which the conveyance case 24 moves is formed in the conveyance chamber 22, and the process chambers 20 are arranged in alignment on both sides of the moving path. The conveyance case 24 has a transfer mechanism as mentioned later so that exchange of substrates can be performed with the process chambers 20.

Figure 3:
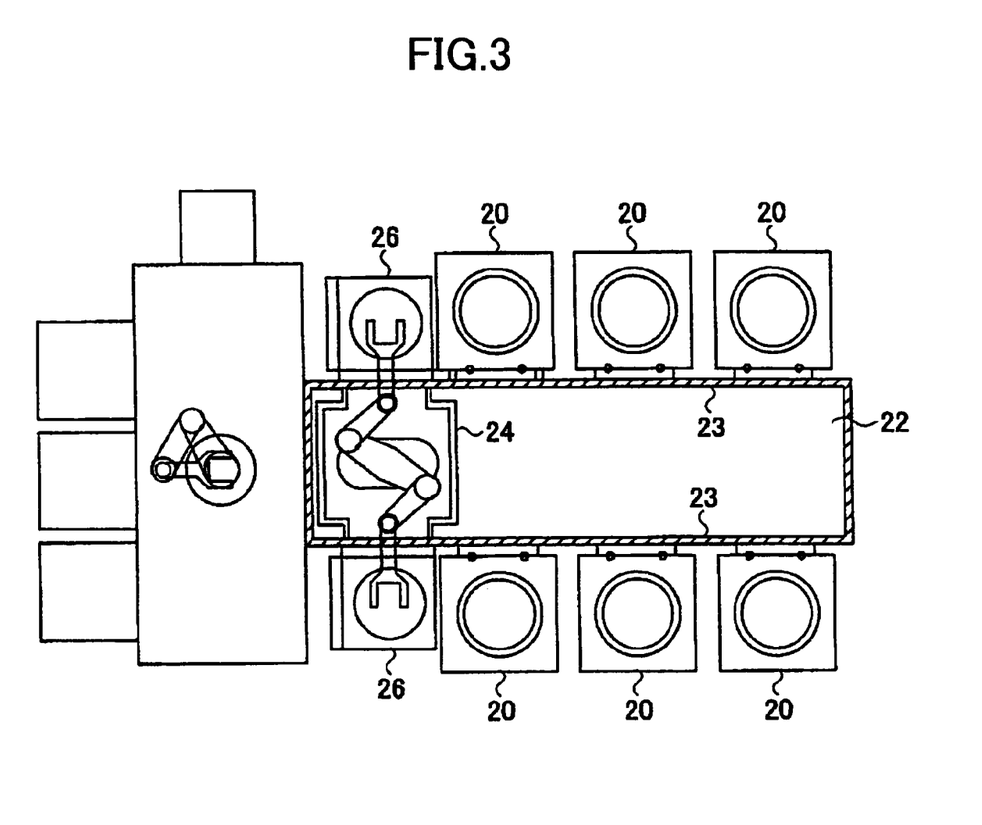
FIG. 3 is a plan view showing a state where a conveyance case is connected to a load-lock chamber in the substrate processing apparatus shown in FIG. 2.

A load-lock chamber 26 is located at an end of each row of the process chambers 20 so that exchange of substrates can be performed with the conveyance case 24 as shown in FIG. 3. When conveying substrates to the processing chambers 20, the substrates are carried in a load-lock chamber 26 from outside, and gases in the load-lock chamber 26 is evacuated so as to set in a predetermined degree of vacuum. The carry-in of the substrates into the load-lock chamber 26 is performed by a transfer robot 28 under an atmospheric pressure environment (an area indicated by double-dashed chain lines in FIG. 2) which is outside the substrate processing apparatus.

When the substrates are carried in the load-lock chamber 26 and the load-lock chamber 26 reaches the predetermined degree of vacuum, the conveyance case 24 moves to a position facing the load-lock chamber 26, and substrate carry-in and carry-out ports of the load-lock chamber 26 and carry-in and carry-out ports of the conveyance case 24 are connected airtightly.

The process chambers 20 are aligned in two rows on both sides of the conveyance chamber 22 so that the conveyance case 24 is arranged to be located and moved between the rows. Accordingly, two substrate carry-in and carry-out ports are provided to the conveyance case 24 so as to be simultaneously connected to the load-lock chambers 26 on both sides. A transfer mechanism including two transfer arms is provided in the conveyance case 24 so as to hold the substrates in the load-lock chambers 26 on both sides by the transfer arms and carry the substrates into the conveyance case 24 (refer to FIG. 3). Thereafter, the conveyance opening of the conveyance case 24 is closed, and the conveyance case 24 is moved in a direction to the process chambers 20 by the transfer mechanism.

The conveyance case 24 stops at a position facing the target process chambers 20, and the substrate carry-in and carry-out ports of the conveyance case 24 and the substrate carry-in and carry-out ports of the process chambers 20 concerned are connected airtightly, and the substrates in the conveyance case 24 are carried in the process chambers 20 concerned by the transfer arms (refer to FIG. 2).

The conveyance case 24, which handed the substrates to the process chambers 20, moves to the position facing the load-lock chambers 26 again so as to receive substrates or receive substrates that have been processed from the process chambers 20, which has completed the process, and conveys the substrates to the load-lock chambers 26.

The conveyance case 24 repeats the above-mentioned operation. If the conveyance case 24 is stopped and is connected to the process chambers 20, the conveyance case 24 is maintained airtight as well as the process chambers 20 and is maintained airtight while moving. Accordingly, the substrates being conveyed are not exposed to an atmosphere, and the inside the conveyance case 24 can always be maintained at a reduced pressure environment.

Accordingly, when connecting the conveyance case 24 to the load-lock chambers 26 or the process chambers 20, there is no need to perform a vacuum exhaust at each time a connection is made since the inside of the conveyance case 24 is maintained at the reduced pressure environment.

In the present embodiment, the process chambers 20 are arranged in alignment on both sides of the moving path of the conveyance case 24 in the conveyance chamber 22, and the load-lock chambers 26 are arranged on both sides of the moving path one on each side. Thus, the conveyance case 24 is provided with the substrate carry-in and carry-out ports (hereinafter, referred to as conveyance ports) on both left and right sides of the moving direction at one on each side so that two substrates are simultaneously conveyed and simultaneously supplied to the process chambers 20 on both sides, thereby performing the conveyance of substrates efficiently.

Additionally, since the transfer mechanism is accommodated in the conveyance case 24 during conveyance, the conveyance chamber 22 merely define a space for moving the conveyance case 24 and there is no need to acquire a movable area of the transfer mechanism in the conveyance chamber 22. Thus, an installation area of the conveyance chamber 22 can be made as small as possible, which can reduce the installation area of the entire substrate processing apparatus.

Here, a description will be given, with reference to FIG. 4 and FIG. 5, of the moving mechanism of the conveyance case 24 and the connection mechanism between the conveyance case 24 and the process chamber 20.

Figure 4:
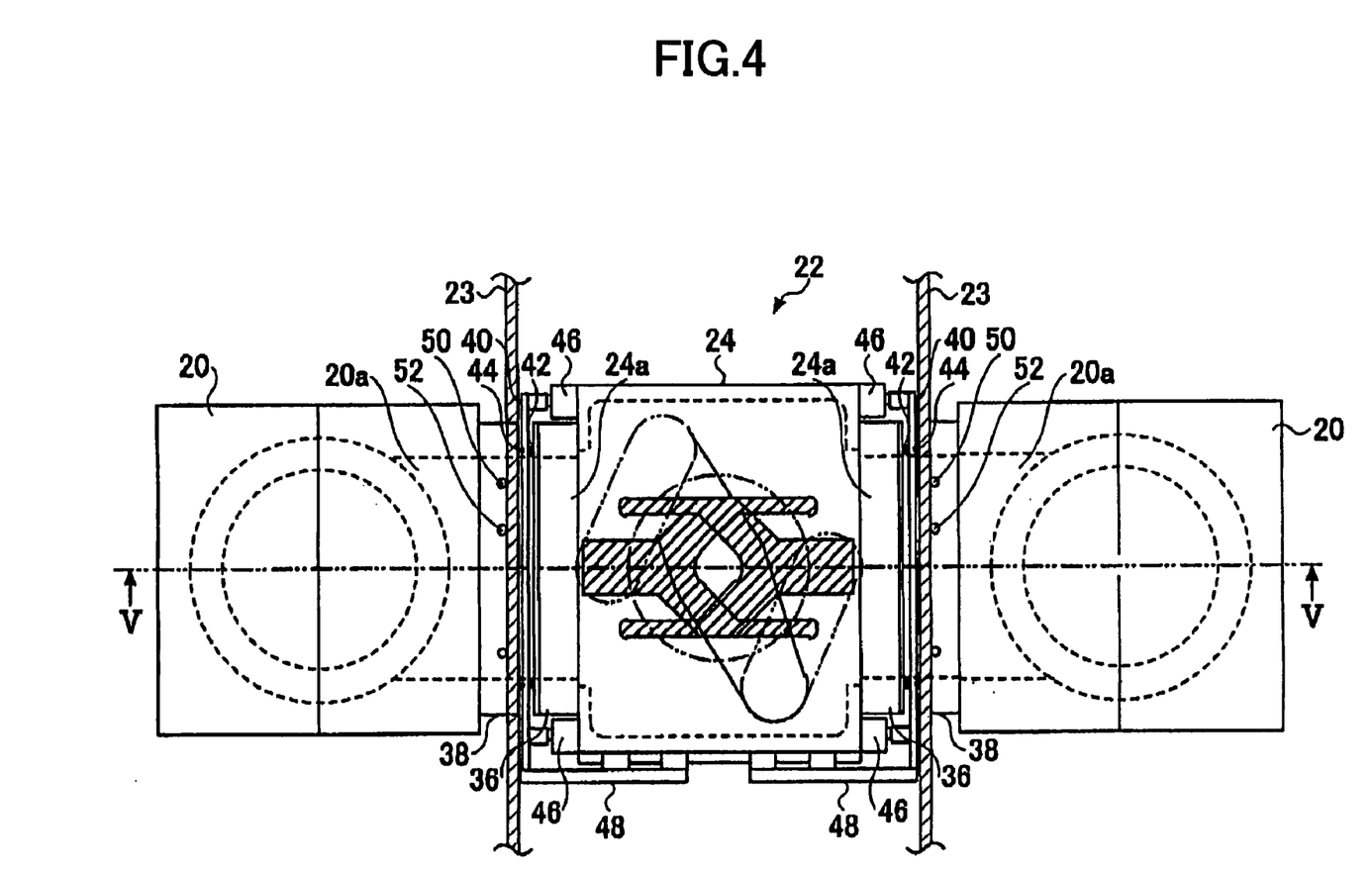
FIG. 4 is a plan view showing a state where the conveyance case is connected to a process chamber in the substrate processing apparatus shown in FIG. 1.
Figure 5:
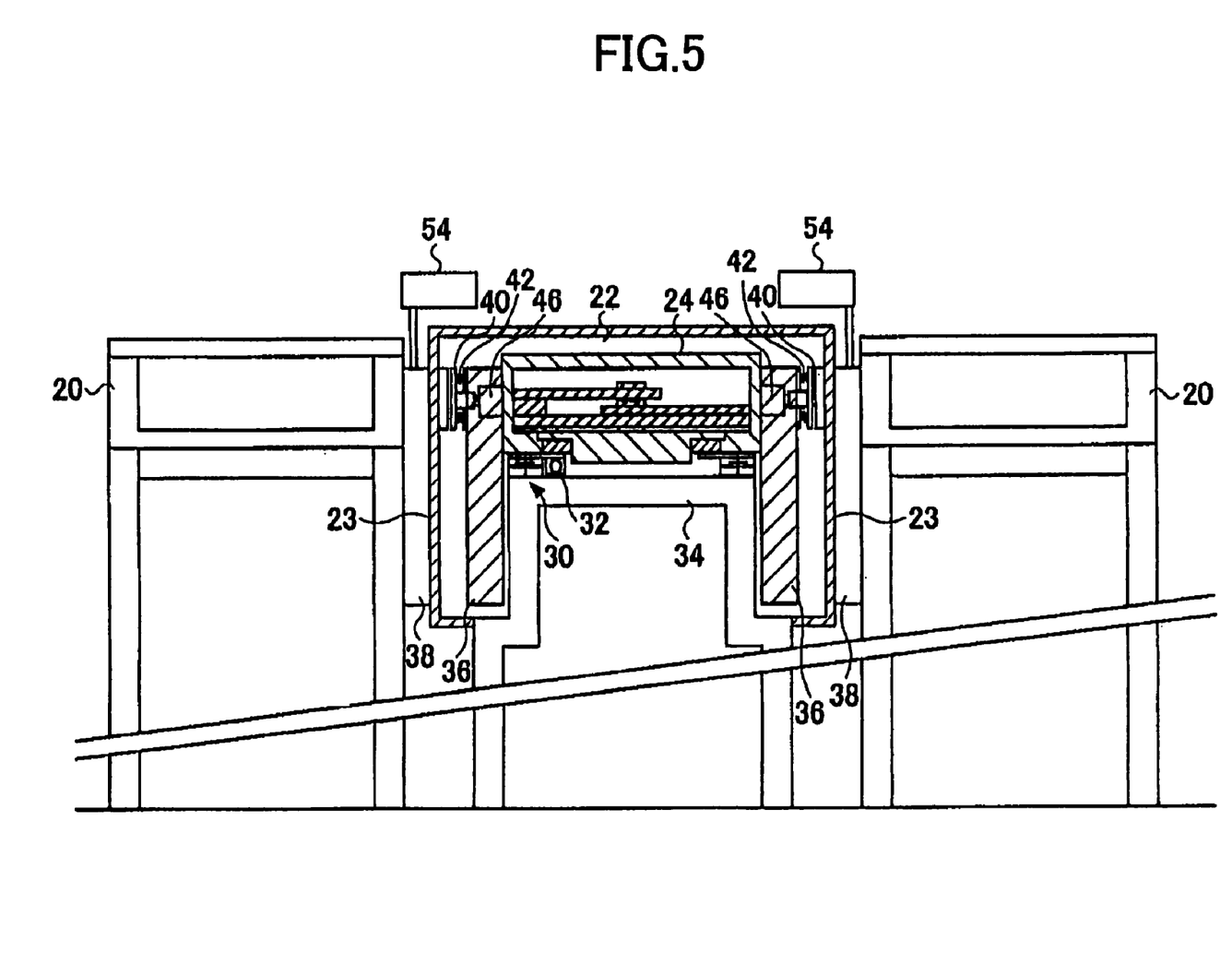
FIG. 5 is a cross-sectional view taken along a line V-V in FIG. 4.

FIG. 4 is a plan view showing a state where the conveyance case 24 is connected to the process chamber 20 in the substrate processing apparatus shown in FIG. 1. FIG. 5 is a cross-sectional view taken along a line V-V in FIG. 4.

First, a description will be given of the moving mechanism of the conveyance case 24. The moving mechanism guides and drives the conveyance case 24 to move linearly within the conveyance chamber 22. The moving mechanism comprises, as shown in FIG. 5, a linear guide 30 that guides the conveyance case 24 to move linearly and a lead screw 32 that drives the conveyance case 24. The linear guide 30 and the lead screw 32 are provided between the conveyance case 24 and a lower frame 34.

The lead screw 32 is driven by an electric motor (not shown in the figure), and converts a rotational movement to a liner movement by a screw mechanism. The conveyance case 24 moves linearly while being guided by the linear guide 30 by the drive force in the direction of the linear movement. By changing the direction of rotation of the lead screw 32, the direction of movement of the conveyance case 24 can be changed to an opposite direction.

Next, a description will be given of the connection mechanism between the conveyance case 24 and the process chamber 20. In order to isolate an interior from an atmosphere and maintain airtight, the conveyance case 24 is provided with gate valves 36 for closing conveyance ports 24a. Since the conveyance case 24 has conveyance ports 24a, one on each of left and right sides, the gate valves 36 are provided one on each of left and right sides.

Additionally, gate valves 38 are provided to conveyance ports 20a of the process chambers 20. The conveyance case 24 is stopped at a position where the gate valves 36 of the conveyance case 24 face the gate valves 38 of the process chambers 20, and the interior of the conveyance case 24 and the interiors of the process chambers 20 are communicated with each other by opening the gate valves 36 and 38. It should be noted that since a gap exists between the bate valves 36 and 38, it is needed to connect airtightly the conveyance ports 24a of the conveyance case 24 and the conveyance ports 20a of the process chambers 20 before opening the gate valves 36 and 38.

Thus, in the present embodiment, a connection plate 40 and a bellows 42 are mounted to an outer side of the connection port 24a of the conveyance case, and the airtight connection is achieved by pressing the connection plate 40 against a peripheral portion of the conveyance port 20a of the process chamber 20. The bellows 42 is provided between the connection plate 40 and the side surface of the gate valve 36 so as to maintain a space between the connection plate 40 and the gate valve 36 airtight. Additionally, an O-ring 44 is attached to a surface of the connection plate 40 opposite to the process chamber 20 so as to achieve the airtight connection when the connection plate 40 is pressed against the gate valve 38.

The connection plate 40 is attracted on the side of the conveyance case 24 while the conveyance case 24 is moving, and the connection plate 40 is pressed against the gate valve 38 after the conveyance case 24 is stopped at the position facing the process chamber 20 and the gate valves 36 and 38 are in an opposing state. The connection plate 40 is driven by an air cylinder 46 attached to the conveyance case 24. That is, after the conveyance case 24 stops while facing the process chamber 20, the connection plate 40 is moved relative to the gate valve 38 of the process chamber 20 by driving the air cylinder 46 and is pressed. Although the connection plate 40 is supported by the air cylinder 46, it is preferable that the connection plate 40 is attached to the liner guide 48 so as to move parallel to the side surface of the gate valve 38.

Even if the connection plate 40 is moved in a direction separating from the gate valve 38, the airtightness between the connection plate 40 and the gate valve 36 is maintained by the bellows 42. When the connection plate 40 reaches the gate valve 38, the O-ring 44 is pressed between the connection plate 40 and the side surface of the gate valve 38, and the airtight connection is achieved. Thus, the connection ports 24a of the conveyance case 24 and the connection ports 20a of the process chambers 20 are connected airtight. In this state, when the gate valves 36 and 38 are opened, the interior of the conveyance case 24 and the interiors of the process chambers 20 are communicated with each other, which permits exchange of substrates between the conveyance case 24 and the process chambers 20. In this circumstance, since the conveyance case 24 and the process chambers 20 are connected airtight as mentioned above, there is no gas flowing into or no deterioration of the reduced pressure environment of the conveyance case 24 and the process chambers 20.

It should be noted that in a case where the inside of the conveyance chamber 22 is at an atmospheric pressure or filled by an inert gas, the space between the gate valve 36 and gate valve 38 (including a thickness of the connection plate 40 and a stroke of the bellows 42) cannot to be a reduced pressure environment. Hereinafter, this space is referred to as a connection space. Thus, it is needed to vacuum the connection space after making the airtight connection by pressing the connection plate 40 against the gate valve 38.

Thus, in the present embodiment, a vacuum exhaust port 50 is provided to the gate valve 38 so as to vacuum the above-mentioned space. Additionally, it is preferable to constitute that a purge port 52 is provided together with the vacuum exhaust port 50 so as to set the above-mentioned space at a pressure equal to the atmosphere when canceling the airtight connection so that the connection plate 40 is easily separated from the gate valve 38.

Moreover, since it is needed to open the gate valves 36 and 38 after the connection space is set to a predetermined degree of vacuum, it is preferable to provided a vacuum sensor 54 that detects a degree of vacuum of the connection space.

It should be noted that the load-lock chamber 26 provided in the row of the process chambers 20 also has a connection mechanism the same as the above-mentioned connection mechanism provided to the process chambers 20, and the load-lock chamber 26 and the conveyance case 24 can be connected airtight. Accordingly, the substrates conveyed into the load-lock chamber 26 from outside can be maintained in a predetermined atmosphere after maintained in the predetermined atmosphere in the load-lock chamber 26 and until conveyed to the process chambers 20 by the conveyance case 24.

Figure 6:
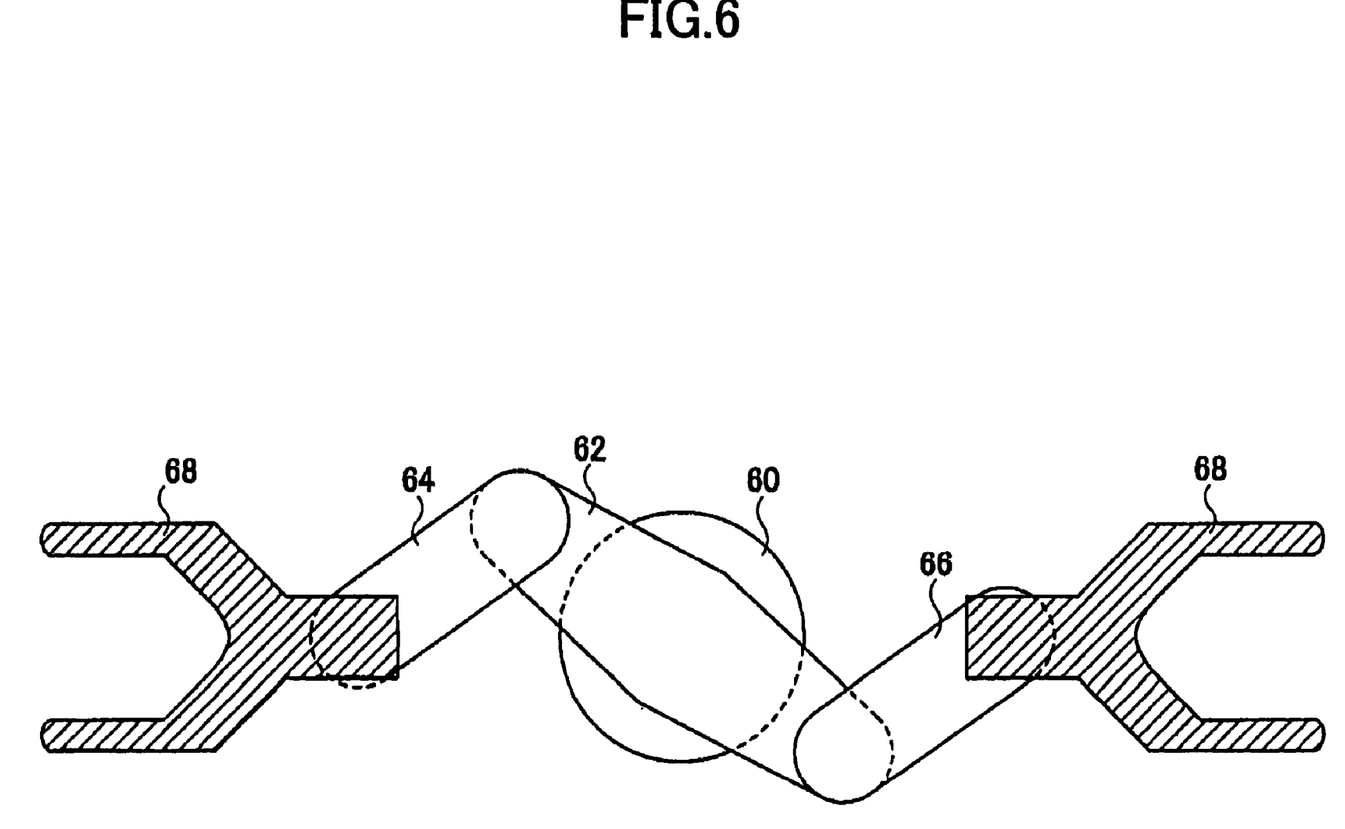
FIG. 6 is a plan vies of a transfer mechanism provided in the conveyance case.
Figure 7:
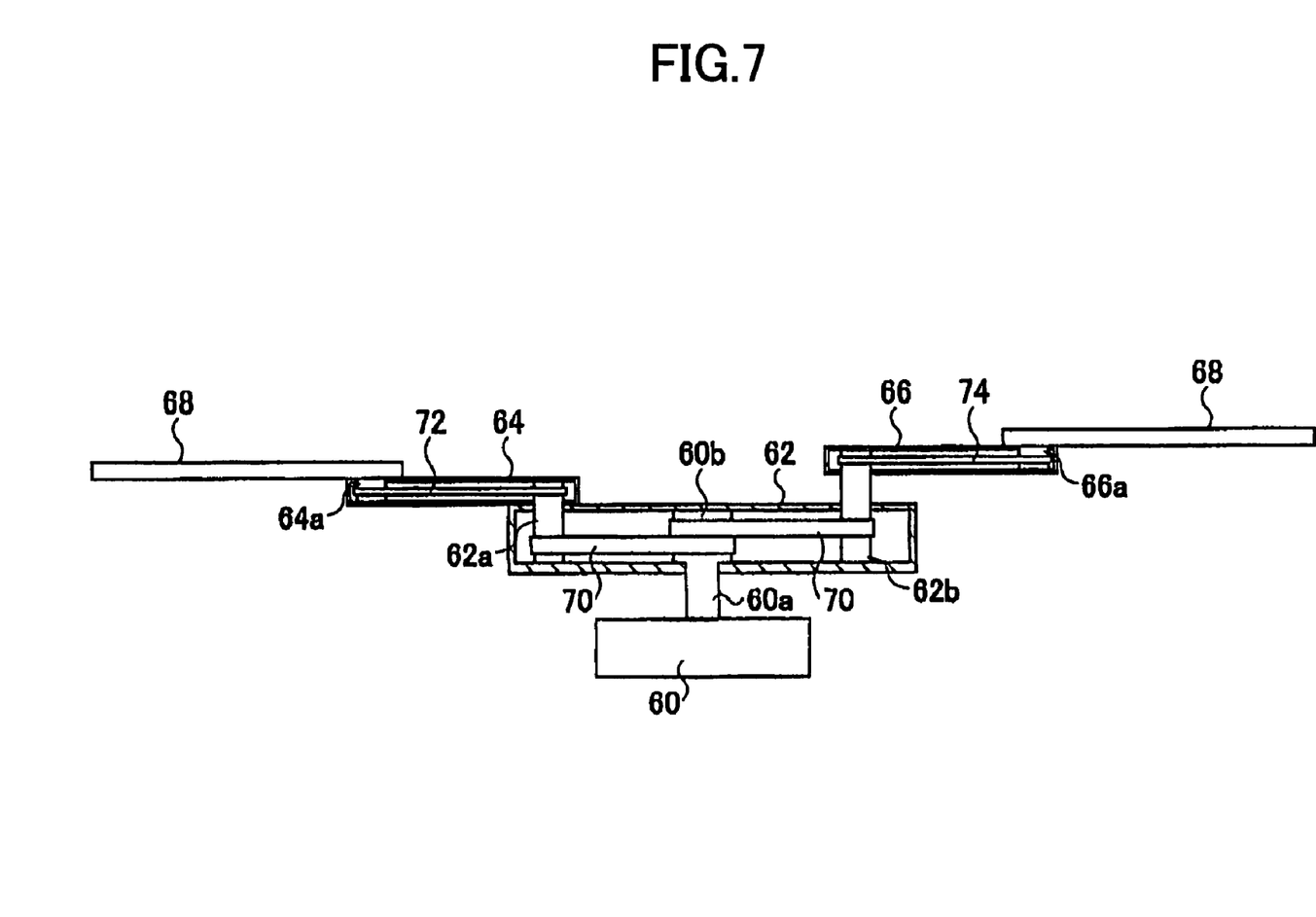
FIG. 7 is a cross-sectional view of the transfer mechanism shown in FIG. 6.

Next, a description will be given, with reference to FIG. 6 and FIG. 7, of the substrate transfer mechanism provided in the conveyance case 24. FIG. 6 is a plan view of the transfer mechanism provided in the conveyance case 24, and FIG. 7 is a cross-sectional view of the transfer mechanism.

The transfer mechanism comprises an electric motor 60 and a common arm 62 rotationally driven by the electric motor 60. The common arm 62 is fixed to a rotational shaft 60a of the electric motor at its center portion, and is rotatable about the center portion. A first arm 64 is attached to an end of the common arm 62, and a second arm 66 is attached to the other end. Further, an end-effector 68 is attached to an end of each of the first arm 64 ad the second arm 66.

Synchronous pulleys 62a and 62b are provided on opposite ends of the common arm 62, and are engaged with a synchronous pulley 60b provided to the rotational shaft 60a of the electric motor 60 via a timing belt 70. The first arm 64 is fixed to an axis of the synchronous pulley 62a so as to rotate with the synchronous pulley 62a. Additionally, a synchronous pulley 64a is attached to an end of the first arm 64, and the synchronous pulley 64a and the synchronous pulley 62a are engaged with each other via a timing belt 72. The end-effector 68 is fixed to the axis of the synchronous pulley 64a. Similarly, the second arm 66 is fixed to an axis of the synchronous pulley 62b so as to rotate with the synchronous pulley 62b. Additionally, a synchronous pulley 66a is attached to an end of the second arm 66, and the synchronous pulley 66a and the synchronous pulley 62b are engaged with each other via a timing belt 74. The end-effector 68 is fixed to the axis of the synchronous pulley 66a.

According to the transfer mechanism of the above-mentioned structure, both end-effectors 68 can be linearly moved in opposite directions. That is, when the rotational shaft 60a of the electric motor 60 is rotated, the end-effectors 68 linearly moves in opposite directions so as to separate away from the electric motor 60, and when the rotation of the rotational shaft 60a is reversed, they move linearly to return toward the electric motor 60. According to such movements of the two end-effectors 68, exchange of substrates can be performed with respect to two process chambers 20 located on both sides of the conveyance case 24.

It should be noted that since the electric motor 60 moves together with the conveyance case 24, a cable for supplying electric power to the electric motor 60 extends from the conveyance case 24, and the cable is pulled around due to the movement of the conveyance case 24. In this case, particles may be generated due to the pull of the cable. In order to avoid such a problem, a small battery may be mounted on the conveyance case 24 so as to drive the electric motor 60, and charge of the battery may be performed according to induction generation of a non-contact type.

As mentioned-above, in the present embodiment, the process chambers 20 are arranged three each on both sides of the conveyance chamber 22, but the number of process chambers 20 is not limited to that, and an arbitrary number of process chambers 20 can be connected by elongating the conveyance chamber 22.

Moreover, if the process performed in the process chamber 20 is a process performed under a reduced pressure, it is preferable that the interior of the conveyance chamber 22 is also set to a reduced pressure environment, but it is not always needed to set the interior of the conveyance chamber 22 to a reduced pressure environment, and may be set to an atmospheric pressure. Additionally, in consideration of a case where leak occurs from the conveyance chamber 22 to the conveyance case 24 or the process chambers 22, an inert gas may be filled within the conveyance chamber 22.

Moreover, although the space where the conveyance case 24 moves is surrounded by the conveyance chamber 22 in the present embodiment, it is not always necessary to provide the conveyance chamber 22. The conveyance chamber 22 is suitable for setting the space where the conveyance case 24 moves to a reduced pressure environment or setting the space to be filled with an inert gas. Alternatively, it is preferable to provide the conveyance chamber 22 so as to prevent scattering of particles generated due to the movement of the conveyance case 24. However, the conveyance chamber 22 is not an essential structural element in the present invention, and what is required is to provide a moving path for moving the conveyance case 24 between the process chambers 20 on both sides.

Additionally, although the transfer mechanism having the two arms operating at the same time is provided in the conveyance case 24 in the present embodiment, the transfer mechanism may have a single arm so as to transfer substrates to the left and right process chambers 20 in turn.

Next, a description will be given of a variation of the substrate processing apparatus according to the first embodiment of the present invention.

Figure 8:
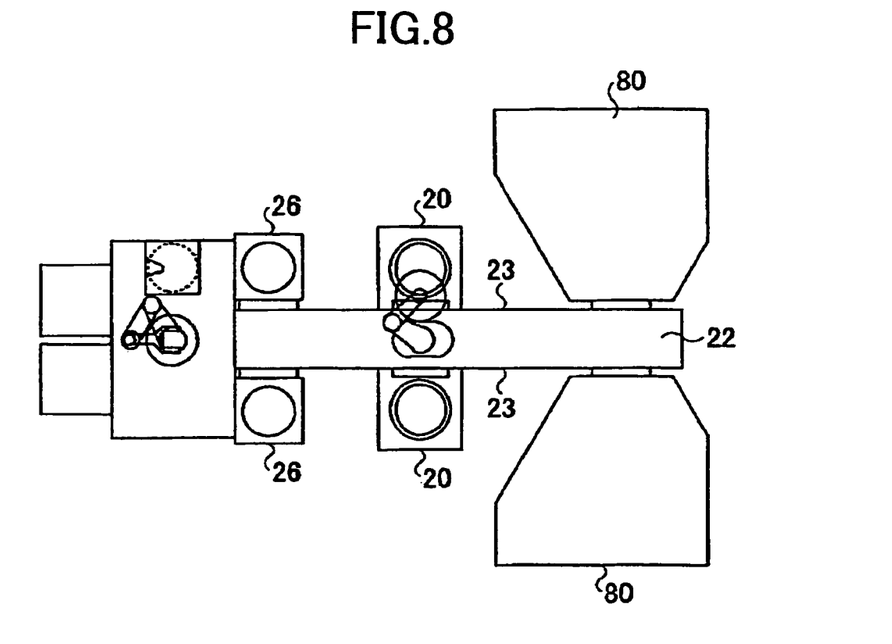
FIG. 8 is an outline plan view showing a first variation of the substrate processing apparatus shown in FIG. 2.

FIG. 8 is an outline plan view of a first variation of the substrate processing apparatus shown in FIG. 2. In this variation, process chambers 80 which perform a different process from that of the process chambers 20 are connected to the conveyance chamber 22. Substrates processed in the process chambers 20 are further conveyed to the process chambers 80 by the conveyance case 24, and are conveyed to outside from the substrate processing apparatus after performing a subsequent process. Accordingly, a plurality of processes can be applied to substrates in a single substrate processing apparatus.

Figure 9:
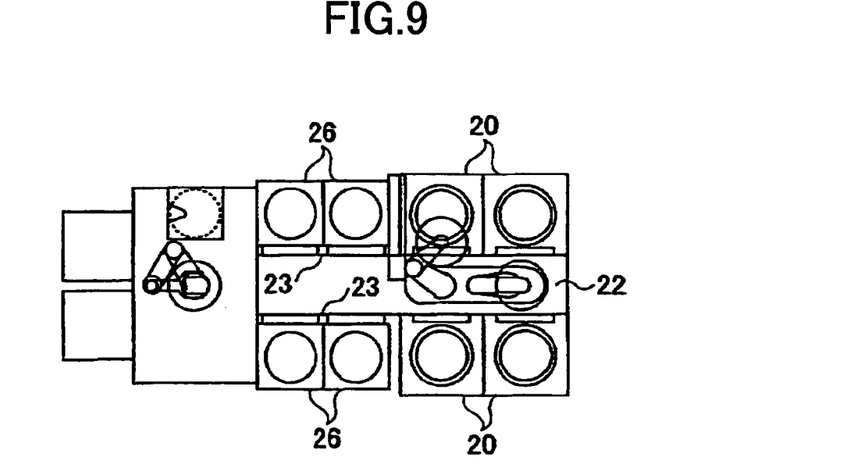
FIG. 9 is an outline plan view showing a second variation of the substrate processing apparatus shown in FIG. 2.

FIG. 9 is an outline plan view showing a second variation of the substrate processing apparatus shown in FIG. 2. In this variation, the load-lock chamber 26 is divided into two with respect to one row of the process chambers 20. Additionally, two conveyance cases 24 are provided by being connected with each other. By constituting as mentioned above, if the transfer mechanism of the conveyance case 24 has two arms operable at the same time, four substrates can be conveyed simultaneously, which increases a throughput of substrate processing.

Figure 10:
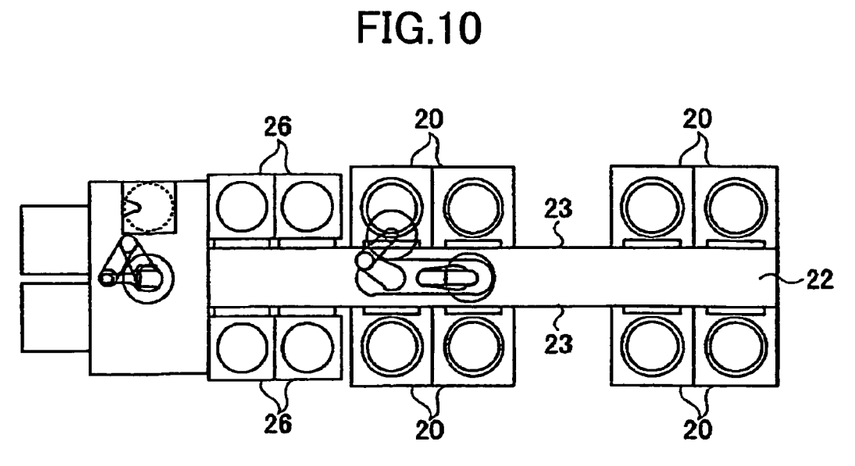
FIG. 10 is an outline plan view showing a third variation of the substrate processing apparatus shown in FIG. 2.

FIG. 10 is an outline plan view showing a third variation of the substrate processing apparatus shown in FIG. 2. In this variation, the conveyance chamber 22 is elongated in the structure shown in FIG. 9, and further process chambers 20 are added and connected to the conveyance chamber 22. Thus, by elongating the conveyance chamber 22 constituting the moving path of the conveyance case 24, more process chambers 20 can be connected to the conveyance chamber 22, which raises a throughput of the substrate processing.

Figure 11:
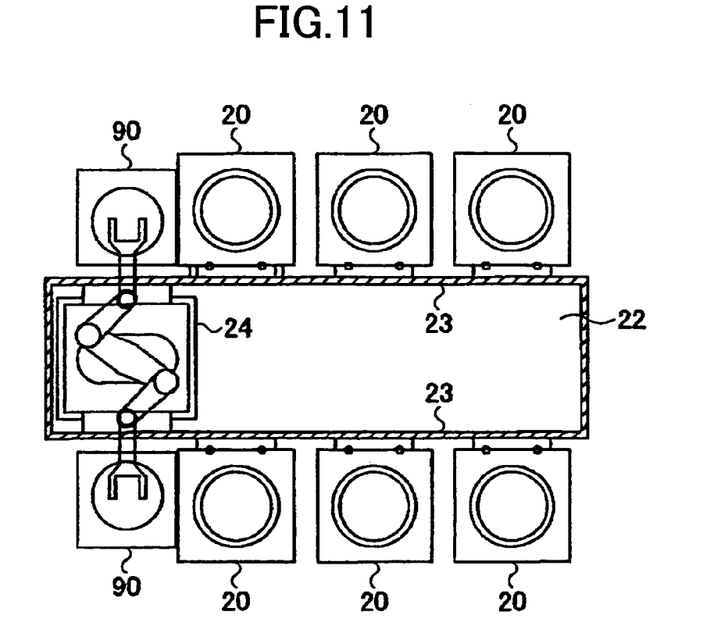
FIG. 11 is an outline plan view of a substrate processing apparatus according to a second embodiment of the present invention.

Next, a description will be given, with reference to FIG. 11, of a substrate processing apparatus according to the second embodiment of the present invention. FIG. 11 is an outline plan view of the substrate process apparatus according to the second embodiment of the present invention. In FIG. 11, parts that are the same as the part shown in FIG. 2 are given the same reference numerals, and descriptions thereof will be omitted.

The substrate processing apparatus shown in FIG. 11 comprises the conveyance chamber 22 and the process chambers 20 connected to the conveyance chamber 22, and the conveyance case 24 moves in the conveyance chamber 22 so as to convey the substrates. This structure is the same as the structure of the substrate processing apparatus shown in FIG. 2.

In the present embodiment, cassette placement stages 90 are provided instead of the load-lock chambers 26. Cassette that accommodates a plurality of substrates arranged in a vertical direction is placed on each of the cassette placement stages 90. Each cassette placement stage 90 has a vertical moving mechanism for moving the cassette up and down. The cassette placement stages 90 are set under an atmospheric pressure atmosphere, and do not have a container which can achieve a reduced pressure environment such as the load-lock chamber 26.

The conveyance case 24 is airtightly constituted like the above-mentioned first embodiment so as to isolate the inside from an outside atmosphere and to maintain a reduced pressure environment. Therefore, in case it moves in the inside of the conveyance chamber 22, the inside of the conveyance case 24 can be maintained in a reduced pressure environment and is airtightly connected to the process chambers 20.

However, since delivery of the substrate with the exterior is performed between the cassettes placed on n the cassette placement stages 90, it is performed under an atmospheric pressure. Therefore, after receiving the substrate from the cassette and closing the gate valve 36, it is necessary to carry out evacuation of gas inside the conveyance case 24 so as to set a reduced pressure environment. That is, in the present embodiment, the conveyance case 24 has a structure to serve also as the load-lock chamber. Additionally, there is no need to provide a transfer robot outside the apparatus to carry substrates in and out of the load-lock chamber.

It should be noted that in the present embodiment, like the above-mentioned first embodiment, it is not always necessary to set inside the conveyance chamber 22 in a reduced pressure atmosphere. Additionally, what is required is to achieve a structure to move the conveyance case 24 between the process chambers 20 arranged in two rows, and it is not always necessary to provide the conveyance chamber 22 itself.

As mentioned above, in the substrate processing apparatus according to the second embodiment of the present embodiment, since the load-lock chamber can be omitted, the entire substrate processing apparatus becomes small and an installation area can be reduced.

The invention claimed is:

1. A substrate processing apparatus comprising:
a plurality of process chambers aligned in two rows for performing a process to substrates therein, each of the process chambers having a first port through which the substrates are conveyed;
a conveyance case located between the two rows of the process chambers for accommodating the substrates in an isolated state from an external atmosphere and conveying the substrates to the process chambers, said conveyance case having two second ports so that the substrates are conveyed between the process chambers and the conveyance case through the first ports and the second ports; and
a moving mechanism that moves the conveyance case along a moving path between the two rows of the process chambers,
wherein said conveyance case has a connecting plate provided to each second port so as to be located between the first ports and each second port for closely connecting the first ports and each second port, and a bellows provided between each connecting plate and each second port for retaining a connection of each connecting plate and each second port, each connecting plate being configured to move back and forth relative to said conveyance case so that each connecting plate is attracted to said conveyance case while moving, and can be pressed against one of the plurality of process chambers when said conveyance case is stopped to convey the substrates between said process chamber and said conveyance case.

2. The substrate processing apparatus as claimed in claim 1, wherein said conveyance case includes a substrate transfer mechanism having first and second arms so that the first arm performs carry-in and carry-out of the substrates with respect to the process chambers in the row on one side and the second arm performs carry-in and carry-out of the substrates with respect to the process chambers in the row on opposite side.

3. The substrate processing apparatus as claimed in claim 2, wherein said substrate transfer mechanism includes a single electric motor and a power transfer mechanism that transfers power of the electric motor to said first and second arms, and said first and second arms are configured and arranged to move symmetrically in directions opposite to each other by the power of the single electric motor.

4. The substrate processing apparatus as claimed in claim 1, wherein said process chambers are configured and arranged to process the substrates under a reduced pressure, and said conveyance case is configured and arranged to be air-tight so that an interior thereof is maintained at a reduced pressure environment.

5. The substrate processing apparatus as claimed in claim 4, wherein said conveyance case is configured and arranged to be connectable to a vacuum exhaust mechanism at a position where the substrates are carried-in from outside.

6. The substrate processing apparatus as claimed in claim 4, wherein a load-lock chamber is arranged at a position along said moving path, the load-lock chamber so as to maintain an atmosphere of the substrates being conveyed by said conveyance case at a reduced pressure environment beforehand, and said conveyance case is configured and arranged to convey the substrates between said load-lock chamber and said process chambers while maintaining the interior at the reduced pressure environment.

7. The substrate processing apparatus as claimed in claim 6, wherein said conveyance case and said moving mechanism are located in a conveyance chamber configured and arranged to be air-tight so as to maintain an interior thereof at a reduced pressure environment.

8. The substrate processing apparatus as claimed in claim 6, wherein said conveyance case and said moving mechanism are located in a conveyance chamber in which an inert gas is filled.

9. The substrate processing apparatus as claimed in claim 6, wherein said conveyance case and said moving mechanism are located in a conveyance chamber which has an interior maintained at an atmospheric pressure or filled with an inert gas, and a vacuum exhaust port is provided to the second ports of said conveyance case so as to form a vacuum in a space formed between the second ports of said conveyance case and the first ports of said process chambers in a state where the second ports of said conveyance case are connected to the first ports of said process chambers.

10. The substrate processing apparatus as claimed in claim 1, wherein the connecting plates and the first ports form a gap while the conveyance case is moving, and contact each other when one of the second ports faces a first port of a target processing chamber.

11. A conveyance case that accommodates substrates in an isolated state from an external atmosphere and conveys the substrates to a plurality of process chambers aligned in two rows in a longitudinal direction of a conveyance chamber housing the conveyance case, said conveyance case being located between the two rows of the process chambers, each of the process chambers having a first port through which the substrates are conveyed, said conveyance case comprising:

two second ports so that the substrates are conveyed between the conveyance case and the process chambers through the first ports and the second ports;

a connecting plate provided to each second port so as to be located between the first ports and each second port for closely connecting the first ports and each second port; and a bellows provided between each connecting plate and each second port for retaining a connection of each connecting plate and each second port, each connecting plate being configured to move back and forth relative to said conveyance case so that each connecting plate is attracted to said conveyance case while moving, and can be pressed against one of the plurality of process chambers when said conveyance case is stopped to convey the substrates between said process chamber and said conveyance case.

12. The conveyance case as claimed in claim 11, wherein the two second ports of said conveyance case are connected at the same time to the first ports of two process chambers of the process chambers aligned in two rows, and a substrate transfer mechanism is provided to carry-in and carry-out the substrates at the same time to the two process chambers.

13. The conveyance case as claimed in claim 11, comprising a substrate transfer mechanism having first and second arms so that the first arm performs carry-in and carry-out of the substrates with respect to the process chambers in the row on one side and the second arm performs carry-in and carry-out of the substrates with respect to the process chambers in the row on opposite side.

14. The conveyance case as claimed in claim 13, wherein said substrate transfer mechanism includes a single electric motor and a power transfer mechanism that transfers power of the electric motor to said first and second arms, and said first and second arms are configured and arranged to move symmetrically in directions opposite to each other by the power of the single electric motor.

15. A substrate processing apparatus comprising:

at least one process chamber for processing a substrate having a first port through which the substrate is conveyed;

a conveyance chamber in which the substrate is moved;

a conveyance case provided in the conveyance chamber, and configured to accommodate the substrate in an isolated state from an atmosphere of the conveyance chamber and connect to the process chamber, said conveyance case having a second port corresponding to the first port of the process chamber so as to convey the substrate through the first and second ports, said conveyance case also having a connecting plate to closely connect the first Dort and the second port and bellows provided between the connecting plate and the second port for retaining a connection of the connecting plate and the second port; and a moving mechanism that moves the conveyance case along a moving path inside the conveyance chamber, said connecting plate being configured to move back and forth relative to said conveyance case so that said connecting plate is attracted to said conveyance case while moving, and can be pressed against the process chamber when said conveyance case is stopped to convey the substrate between the process chamber and said conveyance case.

* * * * *